United States Patent [19]

Amazawa et al.

[11] 4,331,885
[45] May 25, 1982

[54] GATE CIRCUIT

[75] Inventors: Kiyoshi Amazawa; Masaharu Mori; Takashi Taniyama, all of Toda, Japan

[73] Assignee: Clarion Co., Ltd., Tokyo, Japan

[21] Appl. No.: 234,774

[22] Filed: Feb. 17, 1981

Related U.S. Application Data

[63] Continuation of Ser. No. 941,926, Sep. 13, 1978, abandoned.

[30] Foreign Application Priority Data

Sep. 24, 1977 [JP] Japan ............................... 52/113933
Feb. 15, 1978 [JP] Japan ............................... 53/16314
Apr. 21, 1978 [JP] Japan ............................... 53/47226

[51] Int. Cl.³ .................... H03K 17/60; H03B 1/04
[52] U.S. Cl. ............................ 307/254; 307/255; 307/542; 307/546
[58] Field of Search .......... 307/254, 255, 241, 542, 307/546, 549

[56] References Cited

U.S. PATENT DOCUMENTS 3,393,382  7/1968  Myers ................................ 307/254
3,476,956  11/1969 Burgess et al. ..................... 307/254
3,588,538  6/1971  Picillo .............................. 307/254
3,697,772  10/1972 Gibbs ................................ 307/254

Primary Examiner—Andrew J. James
Assistant Examiner—B. P. Davies
Attorney, Agent, or Firm—Wallenstein, Wagner, Hattis, Strampel & Aubel

[57] ABSTRACT

A gate circuit comprised of a first gate transistor normally off; a second gate transistor normally on and connected in a signal path; said first gate transistor being adapted to be turned on when a pulse is applied thereto and said second gate transistor being adapted to be turned off upon the conducting of said first gate transistor, and a limiter for holding the potential at the input of the second gate transistor lower than the potential at the output thereof.

3 Claims, 11 Drawing Figures

GATE CIRCUIT

This is a continuation of application Ser. No. 941,526, filed Sept. 13, 1978, now abandoned.

BACKGROUND OF THE INVENTION

This invention relates to a gate circuit, and more particularly to an improvement in a gate circuit which is suitably used for a noise squelch circuit etc.

Conventional noise squelch circuits employ such a gate circuit as shown in FIG. 1. In FIG. 1, numerals 1 and 2 designate emitter follower amplifiers, numeral 3 a gate transistor and character C a capacitor for holding a voltage level. The transistor 3 is normally in its on state and turned off when a noise enters an input $S_1$ of transistor 1 and a negative noise signal indicating pulse signal P is applied to the base of the transistor 3. Thus, the noise can be removed effectively.

It will be understood that such a pulse signal for controlling the switching of the gate circuit must have a large amplitude. However, as apparent from an equivalent circuit of the gate circuit portion as shown in FIG. 2, the output signal $S_2$ is subject to undesirable influence by a leakage of the pulse signal if the pulse signal of large amplitude is used for cutting off the transistor 3. The employment of the large amplitude pulse signal will cause low dynamic range of the circuit, high resistance of the transistor when saturated and undesirable frequency characteristics of the circuit. In FIG. 2, $D_1$ and $D_2$ are diodes equivalent to the characteristics between the base and collector of the transistor 3 and between the base and emitter thereof, respectively, and SW is an equivalent switch for a short circuit between the base and collector of the transistor 3.

It is an object of the present invention to provide a gate circuit free from any of the disadvantages of the conventional gate circuits as referred to above.

SUMMARY OF THE INVENTION

In accordance with the present invention, there is provided a gate circuit comprised of a first gate transistor normally off, a second gate transistor normally on and connected in a signal path, said first gate transistor being adapted to be turned on when a pulse is applied thereto and said second gate transistor being adapted to be turned off upon the conducting of said first gate transistor, and a limiter for holding the potential at the input of the second gate transistor lower than the potential at the output thereof.

PREFERRED EMBODIMENTS OF THE INVENTION

Figure 3:
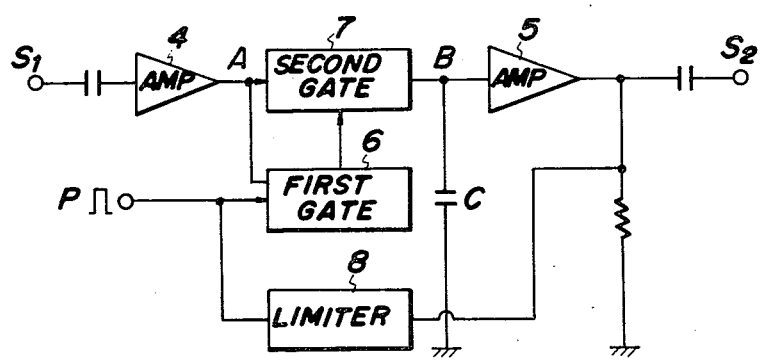
FIG. 3 is a block diagram of a basic formation of the present invention.

Referring now to FIG. 3, there is illustrated a basic formation of the present invention. In FiG. 3, numerals 4 and 5 designate amplifiers, numerals 6 and 7 a first and a second gate, respectively, numeral 8 a limiter and character C a level holding capacitor. Normally, the first gate 6 is in its off state and the second gate is in its on state, and an input signal $S_1$ is fed through the amplifier 4, the second gate 7 and the amplifier 5 and then to output $S_2$. In case a noise enters the input signal $S_1$, a pulse signal P is applied to the first gate 6 to turn it on, and this in turn cuts off the second gate 7, attaining effective removal of the noise. The limiter 8 functions to keep the potential of a point A lower than that of a point B, thereby assuring the normal operation of the second gate 7.

Figure 4:
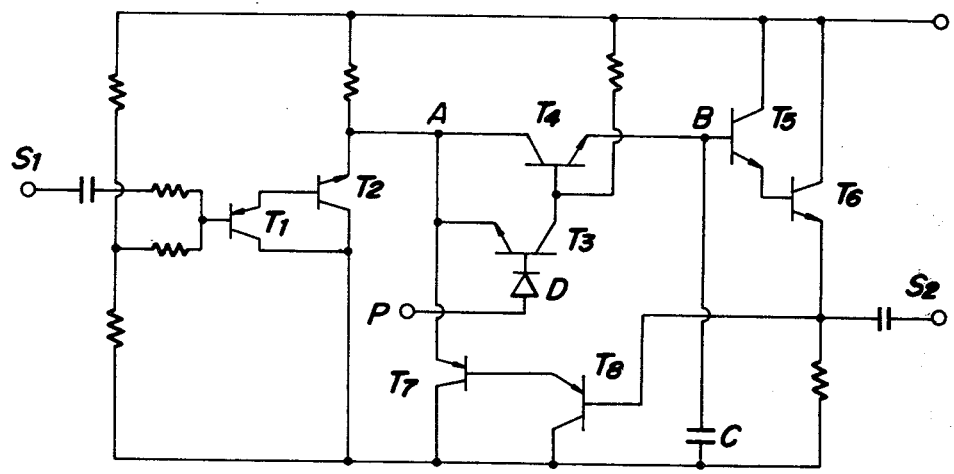
FIG. 4 is a circuit diagram of one embodiment of the present invention.

FIG. 4 shows an exemplary form of a concrete circuit of the basic formation in accordance with the present invention. In FIG. 4, a pair of transistors $T_1$, $T_2$ and a pair of transistors $T_5$, $T_6$ correspond to the amplifiers 4 and 5, respectively; transistors $T_3$ and $T_4$ correspond to the first gate 6 and the second gate 7, respectively; and a pair of transistors $T_7$, $T_8$ corresponds to the limiter 8.

In the so constructed circuit, when a noise enters the input signal $S_1$, a positive pulse signal P is applied to the gate of the transistor $T_3$ to turn it on. As a result, the collector potential of the transistor $T_4$ is cut down to its base potential. Since the emitter potential of the transistor $T_4$ is kept at a certain level due to the capacitor C, a reverse bias is applied to the transistor $T_4$ so long as the potential at the point A is lower than that at the point B. Thus, the transistor $T_4$ is cut off.

In this connection, it is to be noted that if the potential at the point A is higher than the sum of the potential at the point B and the voltage $V_{BE}$ between the base and emitter (hereinafter referred to as "base-emitter voltage $V_{BE}$") of the transistor $T_4$, the transistor $T_4$ is adversely forward-biased to conduct. To prevent this phenomenon, there is provided the limiter comprised of the transistors $T_7$ and $T_8$. Stated illustratively, if the base-emitter voltage $V_{BE}$ of each of the transistors is set so as to satisfy the following formula $$V_{BE}(T_5) + V_{BE}(T_6) = -V_{BE}(T_7) - V_{BE}(T_8),$$

the transistors $T_7$, $T_8$ are turned on when the potential at the point A is raised above that at the point B. Thus, the potential at the point A is kept from being raised above the level. This assures proper switching operation of the transistor $T_4$ for any amplitude of the pulse signal. When the transistor $T_4$ is in its on state, its collector current is larger than its emitter current and there is such a relation as $-V_{BC} < V_{BE}$ (where $V_{BC}$ is a base-collector voltage). Accordingly, the transistors $T_7$ and $T_8$ are in their off states.

Thus, according to the present invention, the switching of the gate can be achieved by a pulse of such a small amplitude as $V_{BC} = V_D$ (where $V_D$ is a forward voltage of a diode D), so that the leakage of the pulse into the output is minimized. Accordingly, the circuit can enjoy large dynamic range at the cut off state and small resistance at the on state together with excellent frequency characteristics.

The gate circuit in accordance with the present invention is applicable to a noise squelch circuit for use in an AM radio receiver, a CB transceiver, etc., and it is also applicable to any type of analog switch.

Figures 5, 6:
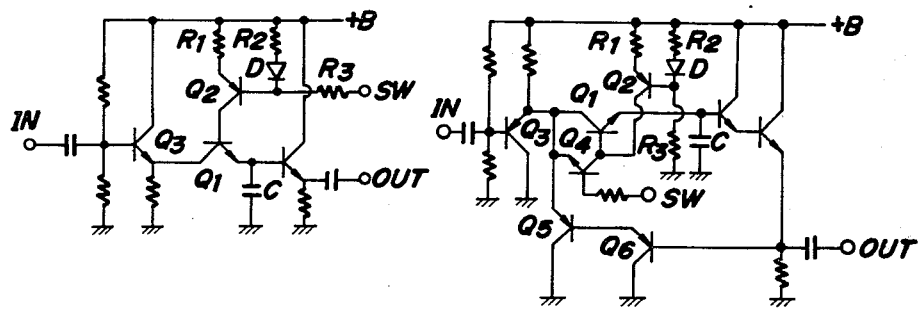
FIGS. 5 and 6 are circuit diagrams of further embodiments of the present invention.

FIG. 5 shows another embodiment of the present invention which is capable of reducing an excess bias current to remove a residual noise due to a switching.

Figure 7:
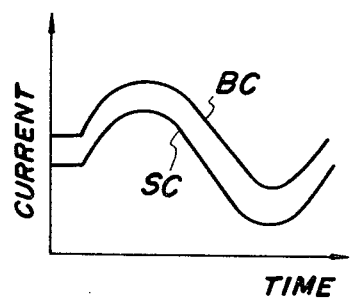
FIG. 7 is a graph showing the relation between a signal current and a bias current in the embodiments shown in FIGS. 5 and 6.

In FIG. 5, a transistor $Q_2$, a diode D and a resistance $R_3$ constitute a constant current circuit and the current value is determined by the resistance $R_3$. In place of the diode D, a transistor may be employed, taking advantage of the transistor's function as a diode. Resistances $R_1$ and $R_2$ are provided for reduction of the influence exerted due to a difference in characteristics between the transistor $Q_2$ and the diode D. The collector current of the transistor $Q_2$ is determined by the resistance $R_3$ of the constant current circuit, and the constant current is applied to the base of a switching transistor $Q_1$ for gating. This circuit formation in accordance with the present invention allows flowing of a current (a constant current determined by the resistance $R_3$) just enough to saturate the transistor $Q_1$ even if an input signal level appearing at the emitter of the transistor $Q_1$ is low in negative and prevents a flow of an excessive current. On the other hand, when the input signal level is high in a positive direction, the constant current is supplied to the base of the transistor $Q_1$ and the resistance at saturation is kept low. This is shown in FIG. 7. More particularly, the bias current BC flows, following the input signal current SC.

FIG. 6 shows a still further embodiment of the present invention, which also employs a constant current circuit. In FIG. 6, such elements as corresponding to the elements of FIG. 5 are shown by corresponding numerals or characters. In this embodiment, a control signal to turn on or off a transistor $Q_1$ is applied to a switching pulse input terminal SW. Normally, a low level signal is applied to the input terminal SW to maintain the transistor $Q_1$ conductive, and a transistor $Q_4$ is in its off position. Accordingly, a transistor $Q_2$ is in its on state and a current same as the current flowing from a power source $+B$ and through a resistance $R_2$, a diode D and a resistance $R_3$ is constantly applied to the base of the transistor $Q_1$. The operations of the transistor $Q_1$ and a capacitor C are identical with those as mentioned above. Transistors $Q_5$ and $Q_6$ act to hold the transistor $Q_1$ in its off state, if the potential of the transistor $Q_1$ is higher at its collector than at its emitter, when an input signal of high level is applied to the terminal SW and the transistor $Q_4$ is turned on to shortcircuit the base and collector of the transistor $Q_1$. Thus, according to the present invention, the switching operation of the transistor $Q_1$ can be controlled by a pulse of small amplitude owing to the employment of the transistor $Q_4$, and the function of the constant current circuit is also effective to more positively remove a switching noise.

The relation between an input signal current and a bias current is identical with that as shown in FIG. 7.

In accordance with the embodiments of FIGS. 5 and 6, the switching noise which is caused by an excess bias current applied to a switching transistor, as is often the case with the conventional technique, can be well removed. Stated illustratively, the employment of the constant current circuit as a bias current source for the switching transistor can prevent an excess current from being flowed, can remove the switching residual noise and can provide excellent frequency characteristics and dynamic range.

Figure 8:
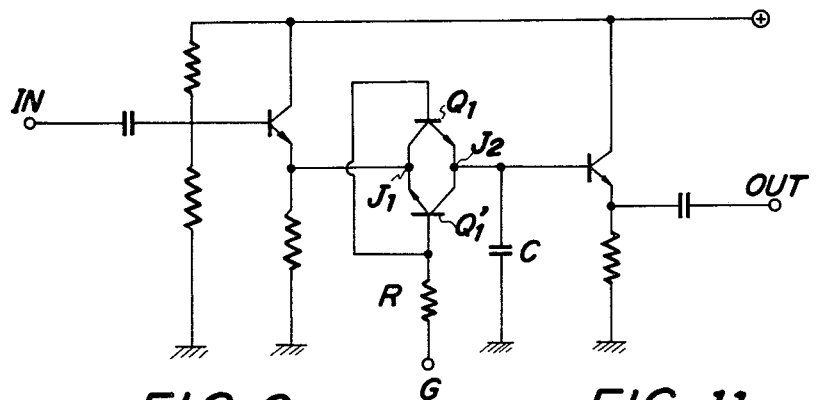
FIG. 8 is a circuit diagram of a still further embodiment of the present invention.

FIG. 8 shows a still further embodiment of the present invention which is capable of reducing a switching noise without causing distortion in the output signal. As compared with the gate circuit configuration of FIG. 1, it is apparent that this embodiment is characterized by use of two transistors $Q_1$, $Q_1'$, as a switching element. The first and the second transistors $Q_1$, $Q_1'$ are so connected with each other that the respective collectors and emitters are coupled in mutually reversed manner. More specifically, the collector of the first transistor $Q_1$ is connected (junction $J_1$) to the emitter of the second transistor $Q_1'$ and the emitter of the first transistor $Q_1$ is connected (junction $J_2$) to the collector of the second transistor $Q_1'$. Both the bases of the first and the second transistor $Q_1$, $Q_1'$ are connected through a resistance R to a gate terminal G to which a switching pulse is applied. Other portions of the gate circuit as shown in FIG. 8 are identical with the gate circuit of FIG. 1.

Figure 1:
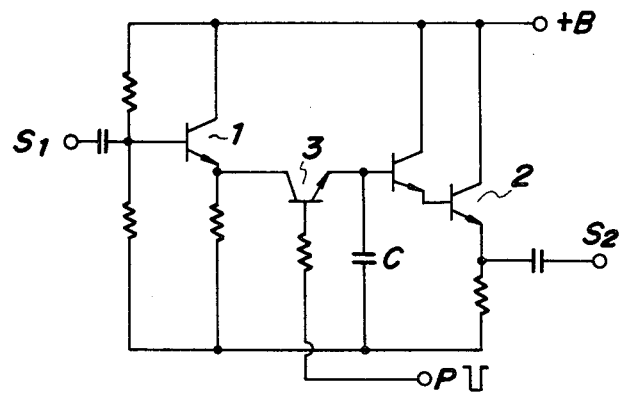
FIG. 1 is a circuit diagram of a conventional noise squelch circuit.
Figure 2:
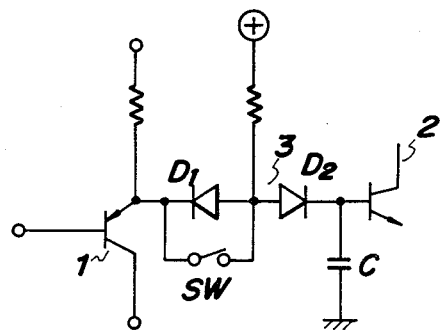
FIG. 2 is an equivalent circuit of a gate circuit portion of FIG. 1.
Figure 9:
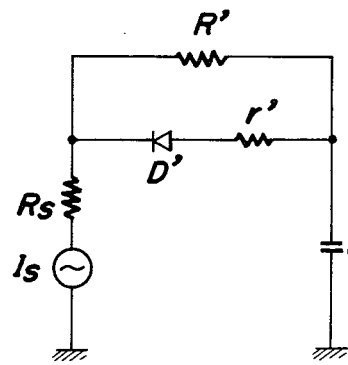
FIG. 9 is an equivalent circuit for a switching transistor $Q_1'$ shown in FIG. 8.
Figure 10:
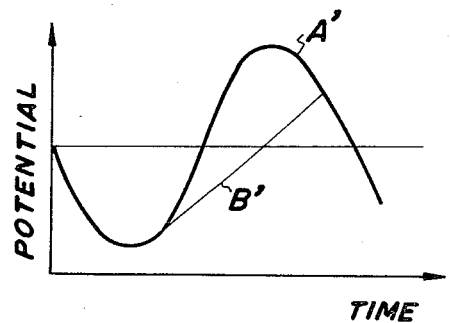
FIG. 10 is a chart of a signal waveform of a gate circuit as shown in FIG. 8, with a switching transistor $Q_1$ removed.

Assuming that the transistor $Q_1$ is out of the circuit and taking only the operation of the transistor $Q_1'$ into consideration, it seems that, as explained referring to FIG. 1, the base current is equivalently increased and the internal resistance is reduced (resistance r') with a negative-going input signal and the internal resistance is increased (Resistance R') with a positive-going input signal when the base current of the transistor $Q_1'$ is kept low enough. Thus, the transistor circuit including a capacitor C can be shown in such an equivalent circuit as of FIG. 9. The input and the output signal are shown in FIG. 10 by a waveform A' and a distorted waveform B'.

Figure 11:
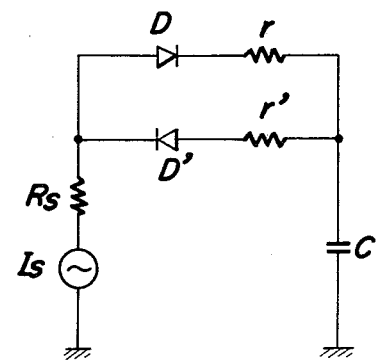
FIG. 11 shows equivalent circuits for the switching transistors $Q_1$ and $Q_1'$ shown in FIG. 8.

Therefore, the circuits of the transistors $Q_1$, $Q_1'$ including the capacitor C as shown in FIG. 8 can be expressed by such equivalent circuits as shown in FIG. 11 when the base currents of the respective transistors are suppressed low. This means that since the base current is considered to be equivalently increased and the inner resistance is decreased with either of the positive- and the negative-going input signal when the base current is suppressed low, there is caused no distortion in a signal waveform at an output terminal OUT of the gate circuit and there appears an output signal identical in waveform with the input signal.

As mentioned in detail above, a gate circuit of FIG. 8, which, complimentarily employs two switching transistors, assures an output signal without distortion because the output signal is compensated even if the bias current is kept low and is very effective to reduce a residual noise due to switching and impart excellent frequency characteristics and dynamic range.

In the claims to follow, the expression "load terminals" are intended to cover the load current carrying terminals such as the emitter and collector terminals of a transistor or the like. The expression "control terminal" is intended to cover the control terminal like the base of a transistor or the like.

What is claimed is:

1. A gate circuit comprising: a signal path in which an input signal having noise signal components is to be fed, said signal path extending between signal input and output terminals; first gate means normally in its off state; second gate means connected in series with said signal path and normally in its on state to allow said signal applied to said signal path to pass therethrough, said first gate means being coupled to said second gate means so that the turning on of said first gate means will turn off said second gate means, said first and second gate means each being a current control device having a control terminal and a pair of load terminals where the current or voltage condition of the control terminal establish a low resistance conduction-on or high resistance conduction-off condition between the load terminals thereof, the load terminals of the device comprising said first gate means being coupled between the control terminal and the load terminal nearest said signal path input terminal of said second gate means so that the conduction-on condition of said first gate means will normally turn off conduction between the load terminals of said second gate means to open said signal path; means for providing a noise-indicating control signal occurring during the noise signal components of said input signal and feeding said control signal to the control terminal of said first gate means to turn it on, thereby allowing said second gate means to be cut off; and limiter means coupled to said load terminal nearest said input terminal of said second gate means and responsive to the potential of the latter load terminal for limiting the input potential of said second gate means to such level as to prevent said second gate means from turning on due to the variation of the input potential voltage when the second gate means is turned off by said first gate means.

2. A gate circuit as set forth in claim 1, wherein said second gate means is comprised of a transistor where said load terminals are the collector and emitter terminals thereof, the collector terminal thereof being the load terminal connected to said signal path input terminal and said first gate means is comprised of another transistor whose load terminals include the collector connected to the base of the former transistor.

3. A gate circuit as set forth in claim 1, which further comprises a constant current source means connected to the control terminal of said second gate means for supplying a bias current thereto so that the bias current flows following the input signal current of the second gate means when said first gate means turns on in response to said control signal, thereby allowing said second gate means to be turned off.

* * * * *